(12) United States Patent
Ikeno et al.

(10) Patent No.: US 12,384,888 B2
(45) Date of Patent: Aug. 12, 2025

(54) CONDENSATION-CURABLE RESIN COMPOSITION, CURED PRODUCT, MOLDED BODY, AND SEMICONDUCTOR DEVICE

(71) Applicant: JNC CORPORATION, Tokyo (JP)

(72) Inventors: Hironori Ikeno, Chiba (JP); Kazuya Suwa, Chiba (JP); Keisuke Nishizawa, Chiba (JP); Ayaka Kiya, Chiba (JP); Kiichi Kawabata, Chiba (JP)

(73) Assignee: JNC CORPORATION, Tokyo (JP)

( * ) Notice: Subject to any disclaimer, the term of this patent is extended or adjusted under 35 U.S.C. 154(b) by 723 days.

(21) Appl. No.: 17/299,309

(22) PCT Filed: Nov. 22, 2019

(86) PCT No.: PCT/JP2019/045755
§ 371 (c)(1),
(2) Date: Jun. 3, 2021

(87) PCT Pub. No.: WO2020/116199
PCT Pub. Date: Jun. 11, 2020

(65) Prior Publication Data
US 2022/0025123 A1 Jan. 27, 2022

(30) Foreign Application Priority Data
Dec. 4, 2018 (JP) .................. 2018-227101

(51) Int. Cl.
| | | |
|---|---|---|
| *C08G 77/04* | (2006.01) | |
| *C08G 77/00* | (2006.01) | |
| *C08G 77/08* | (2006.01) | |
| *C08G 77/16* | (2006.01) | |
| *C08G 77/18* | (2006.01) | |
| *C08K 3/22* | (2006.01) | |
| *C08K 3/34* | (2006.01) | |

(Continued)

(52) U.S. Cl.
CPC ........... *C08G 77/045* (2013.01); *C08G 77/08* (2013.01); *C08G 77/16* (2013.01); *C08G 77/18* (2013.01); *C08K 3/22* (2013.01); *C08K 3/36* (2013.01); *C09K 11/02* (2013.01); *H10H 20/8512* (2025.01); *H10H 20/854* (2025.01);
(Continued)

(58) Field of Classification Search
CPC ...... C08G 77/045; C08G 77/08; C08G 77/16; C08G 77/18; C08G 77/80; C08G 77/12; C08K 3/22; C08K 3/36; C08K 2003/2241; C08K 2003/343; C08K 2201/014; C08K 5/5415; C08K 3/013; C08K 5/56; C09K 11/02; H01L 33/502; H01L 33/56; H01L 33/60; H01L 2933/0091; H01L 33/501; H01L 23/296; H01L 23/29; C08L 83/04; C08L 83/06
See application file for complete search history.

(56) References Cited

U.S. PATENT DOCUMENTS

2015/0380622 A1 12/2015 Miyoshi et al.

FOREIGN PATENT DOCUMENTS

| CN | 104781345 | 7/2015 |
| JP | 2008280420 | 11/2008 |
| | (Continued) | |

OTHER PUBLICATIONS

English Translation of JP2010116462 (Year: 2010).*

(Continued)

*Primary Examiner* — Andrew J. Oyer
(74) *Attorney, Agent, or Firm* — JCIPRNET

(57) ABSTRACT

A condensation-curable resin composition which contains: (A) an organosilicon compound containing a structural unit (i) represented by the following formula (i) and a structural unit (ii) represented by the following formula (ii), having a SiOH group at both ends of the molecular chain, and having a weight average molecular weight of 10,000 or more and 10,000,000 or less; and (B) an organometallic compound having three or more condensation-reactive groups. In formula (i), each $R^1$ is independently a hydrocarbon group having 1 to 8 carbon atoms. In formula (ii), each $R^2$ is independently a hydrocarbon group having 1 to 8 carbon atoms.

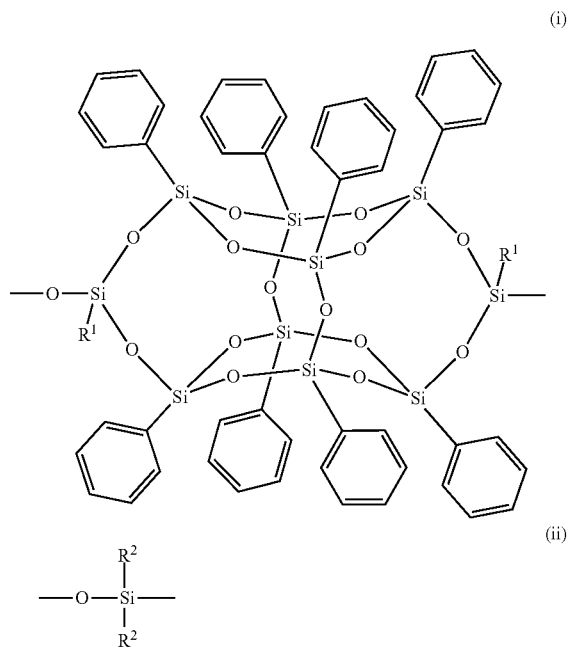

14 Claims, No Drawings

(51) Int. Cl.
  *C08K 3/36*    (2006.01)
  *C09K 11/02*   (2006.01)
  *H10H 20/851*  (2025.01)
  *H10H 20/854*  (2025.01)
  *H10H 20/856*  (2025.01)
(52) U.S. Cl.
  CPC .......... *H10H 20/856* (2025.01); *C08G 77/80* (2013.01); *C08K 2003/2241* (2013.01); *C08K 2003/343* (2013.01); *C08K 2201/014* (2013.01)

(56) References Cited

FOREIGN PATENT DOCUMENTS

| JP | 2010116462 | 5/2010 |
| JP | 2010116464 | 5/2010 |
| JP | 2011190413 | 9/2011 |
| JP | 2015222767 | 12/2015 |
| JP | 2016003317 | 1/2016 |
| JP | 2016027620 | 2/2016 |
| JP | 2016225664 | 12/2016 |
| JP | 2017014320 | 1/2017 |
| WO | 2020004545 | 1/2020 |

OTHER PUBLICATIONS

"International Search Report (Form PCT/ISA/210) of PCT/JP2019/045755," mailed on Feb. 4, 2020, with English translation thereof, pp. 1-5.

"Office Action of Taiwan Counterpart Application", issued on Mar. 29, 2024, with English translation thereof, p. 1-p. 15.

* cited by examiner

CONDENSATION-CURABLE RESIN COMPOSITION, CURED PRODUCT, MOLDED BODY, AND SEMICONDUCTOR DEVICE

CROSS-REFERENCE TO RELATED APPLICATION

This application is a 371 application of the international PCT application serial no. PCT/JP2019/045755, filed on Nov. 22, 2019, which claims the priority benefit of Japan application no. 2018-227101, filed on Dec. 4, 2018. The entirety of each of the above-mentioned patent applications is hereby incorporated by reference herein and made a part of this specification.

BACKGROUND

Technical Field

The present invention relates to a condensation-curable resin composition, a cured product, a molded body, and a semiconductor device.

Related Art

An optical semiconductor device including an optical semiconductor element such as a light emitting diode (LED) has been put into practical use in various lighting devices, electric bulletin boards, traffic lights, backlights of liquid crystal display devices, LED displays, and the like. In these optical semiconductor devices, the optical semiconductor element is usually encapsulated with a transparent encapsulation material. In recent years, in the optical semiconductor industry, demands for higher output and smaller and thinner packages are growing, and the heat density per unit volume tends to increase. Therefore, problems such as yellowing and embrittlement of the encapsulation material are becoming more serious. The same applies to semiconductor devices other than optical semiconductor devices.

Due to high heat resistance, silicone resins have been widely used as encapsulation materials in place of epoxy resins. In addition, these resins are also used as materials for forming light reflection walls, wavelength conversion layers and the like in optical semiconductor devices. Known curable compositions using silicone resins include: compositions which are cured by forming a Si—C bond with a hydrosilylation reaction between a hydrosilyl group and a vinyl group, compositions which are cured by forming a Si—O bond with a condensation reaction between a silanol group (SiOH group) and an alkoxysilyl group, and the like. In the case of the compositions that are cured by a hydrosilylation reaction, the Si—C bond formed during curing has a lower binding energy than that of the Si—O bond, and thus the Si—C bond is broken and the Si—O bond formation proceeds at a high temperature of 200° C. or higher. Therefore, the encapsulation materials that are cured by a hydrosilylation reaction become hard and brittle at a high temperature of 200° C. or higher, and cracks occur easily. On the other hand, as the encapsulation materials that are cured by a condensation reaction between a silanol group and an alkoxysilyl group, encapsulation materials which contain polydimethylsiloxane having a silanol group at both ends and a narrow molecular weight distribution, alkoxysilane, and the like are described in Patent literatures 1 and 2. In Patent literatures 1 and 2, it is shown that the obtained cured product has a low weight loss rate and no cracks in the heat resistance evaluation test.

In addition, it is known that a siloxane polymer containing a silsesquioxane structure has excellent heat resistance. A crosslinkable composition containing the above siloxane polymer is described in Patent literature 3.

On the other hand, a glass plate or a sintered plate usually has higher heat resistance than resin. Therefore, a glass plate in which a fluorescent substance is dispersed or a sintered plate of a fluorescent substance may be used instead of a resin for a wavelength conversion layer or the like that is particularly susceptible to thermal deterioration in an optical semiconductor device (see Patent literatures 4 and 5).

LITERATURE OF RELATED ART

Patent Literature

Patent literature 1: Japanese Patent Laid-open No. 2016-3317
Patent literature 2: Japanese Patent Laid-open No. 2015-222767
Patent literature 3: Japanese Patent Laid-open No. 2010-116464
Patent literature 4: Japanese Patent Laid-open No. 2016-27620
Patent literature 5: Japanese Patent Laid-open No. 2016-225664

SUMMARY

Problems to be Solved

The encapsulation materials using polydimethylsiloxane as described in Patent literatures 1 and 2 do not have sufficient long-term reliability against heat resistance, for example, embrittlement, coloring and the like occur when the encapsulation materials are exposed to a high temperature for a long period of more than 1,000 hours. On the other hand, in Patent literature 3, only a crosslinkable composition cured by a hydrosilylation reaction is implemented, and there is concern that the cured product of the crosslinkable composition has cracks generated in a high temperature environment as described above. In addition, in Patent literature 3, a result that the mass loss due to thermal decomposition was small even under heating is shown in terms of heat resistance, but crack resistance, color resistance and the like required for the encapsulation materials of semiconductor elements are not considered. In addition, when a glass plate or a sintered plate is used, the cost is high due to the difficulty of molding, and an adhesive is required for attachment thereof. Consequently, the heat resistance of the resin serving as the adhesive becomes a problem.

The present invention has been achieved based on the above circumstances, and the present invention provides a condensation-curable resin composition and a cured product capable of obtaining a molded body which hardly causes embrittlement and coloring even when exposed to a high temperature for a long period of time, and provide a molded body and a semiconductor device using the condensation-curable resin composition and the cured product.

Means to Solve Problems

The invention achieved to solve the above problems is a condensation-curable resin composition (α) which contains:

(A) an organosilicon compound containing a structural unit (i) represented by the following formula (i) and a structural unit (ii) represented by the following formula (ii), having a SiOH group at both ends of the molecular chain, and having a weight average molecular weight of 10,000 or more and 10,000,000 or less; and (B) an organometallic compound having three or more condensation-reactive groups.

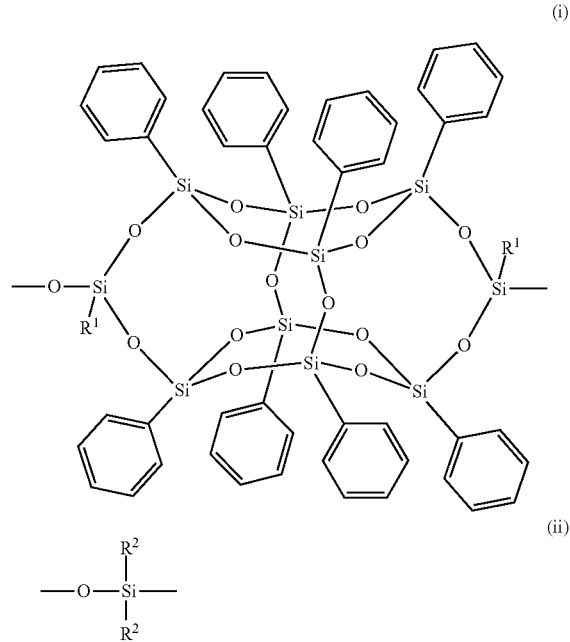

(In formula (i), each $R^1$ is independently a hydrocarbon group having 1 to 8 carbon atoms. In formula (ii), each $R^2$ is independently a hydrocarbon group having 1 to 8 carbon atoms.)

It is preferable that the polymerization degree of the structural unit (i) in the organosilicon compound (A) is 10 or more and 8,000 or less, and the polymerization degree of the structural unit (ii) is 1 or more and 10,000 or less.

The organosilicon compound (A) is preferably represented by the following formula (1).

(In formula (1), each $R^1$ is independently a hydrocarbon group having 1 to 8 carbon atoms. Each $R^2$ is independently a hydrocarbon group having 1 to 8 carbon atoms. m is a numerical value satisfying the weight average molecular weight of 10,000 or more and 10,000,000 or less. n is an average value satisfying 1 to 30.)

The organometallic compound (B) is preferably represented by the following formula (2).

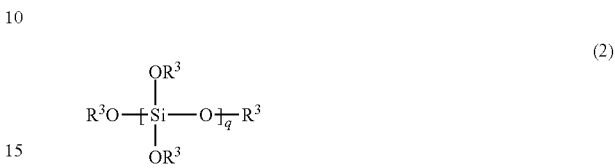

(In formula (2), each $R^3$ is independently an alkyl group having 1 to 4 carbon atoms. q is an average value satisfying 1 to 100.)

The condensation-curable resin composition (a) preferably further contains (C) a condensation catalyst.

The condensation-curable resin composition (a) preferably further contains a solvent (D).

The condensation-curable resin composition (a) preferably further contains (E) a fluorescent substance, (F) a white pigment, or (G) an inorganic oxide (excluding components corresponding to the fluorescent substance (E) or the white pigment (F)).

The content of the fluorescent substance (E) is preferably 1 part by mass or more and 80 parts by mass or less with respect to a total of 100 parts by mass of the organosilicon compound (A) and the organometallic compound (B).

The white pigment (F) is preferably titanium oxide, and the content of the white pigment (F) is preferably 10 parts by mass or more and 80 parts by mass or less with respect to a total of 100 parts by mass of the organosilicon compound (A) and the organometallic compound (B).

Another invention achieved to solve the above problems is a condensation-curable resin composition (β) which is a condensation-curable resin composition containing an organosilicon compound, wherein when the following tensile test and the following light transmittance measurement

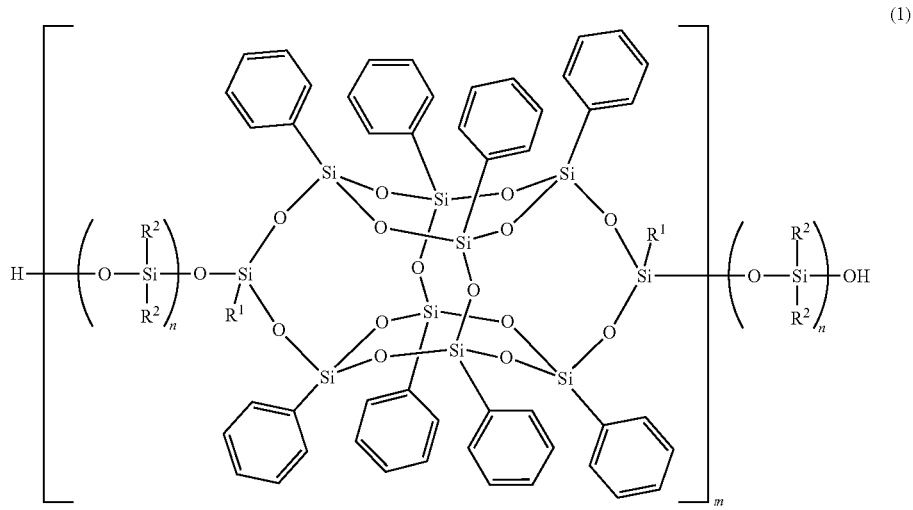

of a cured product obtained under the following thermosetting conditions are performed before and after heating the cured product at 250° C. for 504 hours in an air atmosphere,
the ratio (Eb/Ea) of a breaking elongation (Eb) after the heating to a breaking elongation (Ea) before the heating is 0.1 or more,
the ratio (Sb/Sa) of a breaking stress (Sb) after the heating to a breaking stress (Sa) before the heating is 0.5 or more and less than 10, and
the ratio (Tb/Ta) of a light transmittance (Tb) after the heating to a light transmittance (Ta) before the heating is 0.9 or more.
(Thermosetting Conditions)
Heating is continuously performed in an air atmosphere in an order of 70° C. for 30 minutes, 100° C. for one hour, and 200° C. for two hours
(Tensile Test)
A strip-shaped test piece with a length of 50 mm, a width of 5 mm and a thickness of 0.2 mm is made, and the test piece is subjected to the tensile test at a tensile speed of 5 mm/min at a temperature of 25° C.
(Measurement of Light Transmittance)
The transmittance of light at a wavelength of 350 nm is measured for a test piece that is a cured product with a thickness of 0.1 mm Still another invention achieved to solve the above problems is a cured product obtained by curing the condensation-curable resin composition (α) or the condensation-curable resin composition (β).

Still another invention achieved to solve the above problems is a molded body obtained from the condensation-curable resin composition (α), the condensation-curable resin composition (β), or the cured product.

Still another invention achieved to solve the above problems is a semiconductor device including a semiconductor element and the molded body for encapsulating the semiconductor element.

[Effect]

According to the present invention, it is possible to provide a condensation-curable resin composition and a cured product capable of obtaining a molded body which hardly causes embrittlement and coloring even when exposed to a high temperature for a long period of time, and provide a molded body and a semiconductor device using the condensation-curable resin composition and the cured product.

DESCRIPTION OF THE EMBODIMENTS

Hereinafter, a condensation-curable resin composition, a cured product, a molded body, and a semiconductor device according to an embodiment of the present invention are described in detail.

<Condensation-Curable Resin Composition (α)>

A condensation-curable resin composition (α) according to an embodiment of the present invention contains (A) an organosilicon compound and (B) an organometallic compound. The condensation-curable resin composition (α) can further contain (C) a condensation catalyst, (D) a solvent, (E) a fluorescent substance, (F) a white pigment, and (G) an inorganic oxide (excluding the fluorescent substance (E) and the white pigment (F)) as suitable components. The condensation-curable resin composition (α) may further contain other components. In addition, the condensation-curable resin composition (α) includes a composition obtained by mixing two or three or more compositions, a composition used by mixing two or three or more compositions, a composition before mixing, and the like. That is, the condensation-curable resin composition (α) may be a two-pack composition, a three-pack composition or the like. As for each component of (A) to (F), one type can be used alone or two or more types can be mixed and used. Hereinafter, each component constituting the condensation-curable resin composition (α) is described in detail.

(Organosilicon Compound (A))

The organosilicon compound (A) contains a structural unit (i) and a structural unit (ii). In addition, a SiOH group is present at both ends of the molecular chain of the organosilicon compound (A). The condensation-curable resin composition (α) is a condensation-curable composition which contains the organosilicon compound (A) having a structural unit (i) being a double-decker type silsesquioxane structure and a structural unit (ii) being a siloxane structure. When the condensation-curable resin composition (α) is thermally cured, a molded body which hardly causes embrittlement and coloring even when exposed to a high temperature for a long period of time can be obtained. Specifically, the molded body obtained by curing the condensation-curable resin composition has excellent crack resistance in a high temperature environment and hardly causes thermal deterioration of the mechanical strength and the like. In addition, the obtained molded body also has excellent color resistance in a high temperature environment and hardly causes thermal deterioration of the light transmission property.

(Structural Unit (i))

The structural unit (i) is represented by the following formula (i).

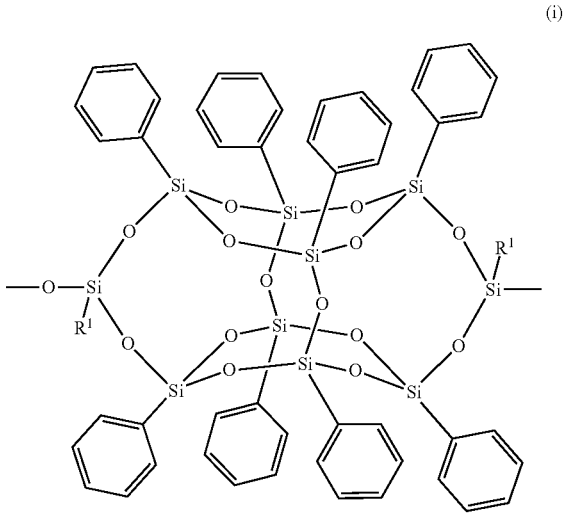

(i)

In formula (i), each $R^1$ is independently a hydrocarbon group having 1 to 8 carbon atoms.

The hydrocarbon group represented by $R^1$ includes an aliphatic chain hydrocarbon group, an alicyclic hydrocarbon group, and an aromatic hydrocarbon group. The aliphatic chain hydrocarbon group may include an alkyl group such as a methyl group, an ethyl group and a propyl group, an alkenyl group such as a vinyl group and a propenyl group, an alkynyl group such as an ethynyl group and a propynyl group, and the like. The alicyclic hydrocarbon group may include, for example, a cyclopropyl group, a cyclobutyl group, a cyclohexyl group, a cyclohexenyl group and the like. The aromatic hydrocarbon group may include a phenyl group, a tolyl group and the like.

As the upper limit of the number of carbon atoms of $R^1$, 5 is preferable, and 3 is more preferable. $R^1$ is preferably an aliphatic chain hydrocarbon group, more preferably an alkyl group, and further preferably a methyl group. When $R^1$ is one of these groups, the optical performance and ease of synthesis are more satisfactory.

The lower limit of the polymerization degree of the structural unit (i), that is, the double-decker type silsesquioxane structural unit in the organosilicon compound (A) is preferably 10, more preferably 15, and further preferably 40. In addition, the upper limit of the polymerization degree is preferably 8,000, more preferably 5,000, and further preferably 1,000, 500 or 200. Moreover, the polymerization degree refers to the average number of structural units contained in one molecule.

(Structural Unit (ii))

The structural unit (ii) is represented by the following formula (ii).

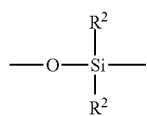

(ii)

In formula (ii), each $R^2$ is independently a hydrocarbon group having 1 to 8 carbon atoms.

The hydrocarbon group represented by $R^2$ is the same as that exemplified as the hydrocarbon group represented by $R^1$. The upper limit of the number of carbon atoms of $R^2$ is preferably 5, and more preferably 3. $R^2$ is preferably an aliphatic chain hydrocarbon group, more preferably an alkyl group, and further preferably a methyl group. When $R^2$ is one of these groups, the optical performance and ease of synthesis are more satisfactory.

The lower limit of the polymerization degree of the structural unit (ii), that is, the siloxane structural unit in the organosilicon compound (A) is preferably 1, more preferably 10, and further preferably 50. In addition, the upper limit of the polymerization degree is preferably 10,000, more preferably 2,000, and further preferably 1,000 or 500.

In the organosilicon compound (A), it is preferable to form a polysiloxane chain in which a plurality of structural units (ii) are linked. The organosilicon compound (A) may have one or more of the above polysiloxane chains in one molecule. The polymerization degree of the structural unit (ii) in the polysiloxane chain is, for example, 1 or more and 30 or less. The lower limit of the polymerization degree is preferably 2, and more preferably 3. On the other hand, the upper limit of the polymerization degree is preferably 15, more preferably 10, and further preferably 6. That is, the polysiloxane chain is formed of, for example, an average of 1 or more and 30 or less structural units (ii). When the polymerization degree of the structural unit (ii) in the polysiloxane chain is within the above range, the performance of the structural unit (i) being a silsesquioxane structure and the performance of the structural unit (ii) being a siloxane structure are well-balanced, and the heat resistance or the like of the obtained molded body is further improved.

The organosilicon compound (A) usually has a linear molecular chain structure. In the organosilicon compound (A), a SiOH group (silanol group) is present at both ends of the molecular chain. The SiOH group refers to a group formed by bonding a silicon atom (Si) with a hydroxy group (OH). In the present specification, the SiOH group and the silanol group are synonymous, and the SiOH group is also referred to as a silanol group. The silicon atom in the silanol group has four bonds, one of which is bonded to a hydroxy group. The atom or group to which the other three bonds of the silicon atom are bonded is not particularly limited. In addition, the silanol group at both ends of the molecular chain may overlap with a part of the structural unit (i) and the structural unit (ii).

The arrangement of structural units such as the structural unit (i) and the structural unit (ii) in the organosilicon compound (A) is not particularly limited. In addition, the orientation of the structural unit (i) and the structural unit (ii) is not limited either. The organosilicon compound (A) may have a structure in which a hydrogen atom or a hydroxy group is bonded to both ends of a polymer chain formed of one or more structural units (i) and one or more structural units (ii), respectively. When the atom at the outmost end of the polymer chain constituted of the structural unit (i) and the structural unit (ii) is a silicon atom, the silanol group is formed by bonding a hydroxy group to the silicon atom at the outmost end. On the other hand, when the atom at the outmost end of the polymer chain is an oxygen atom in siloxane, the silanol group is formed by bonding a hydrogen atom to the oxygen atom at the outmost end. In addition, the structural unit located at both ends of the polymer chain is preferably the structural unit (ii).

A preferable form of the organosilicon compound (A) may be a polymer in which a hydrogen atom or a hydroxy group is bonded to both ends of a polymer chain consisting of a repeating structure of one structural unit (i) and a polysiloxane chain formed by connecting a plurality of structural units (ii). More specifically, the organosilicon compound (A) preferably has a repeating structure of each structural unit shown as the compound represented by formula (1) described later.

The organosilicon compound (A) may further have structural units other than the structural unit (i) and the structural unit (ii). However, other structural units preferably do not contain vinyl groups or other crosslinkable groups. Moreover, the crosslinkable group refers to a group capable of a cross-linking reaction and may be a vinyl group, a hydrosilyl group and the like. It is more preferable that the organosilicon compound (A) has a structure having a crosslinkable group only at both ends. The number (average number) of the crosslinkable groups contained in the organosilicon compound (A) is preferably 5 or less, more preferably 3 or less, and particularly preferably 2. In addition, the content ratio of the other structural units in the total structural units of the organosilicon compound (A) is preferably 10 mol % or less, and more preferably 1 mol % or less.

The lower limit of the weight average molecular weight of the organosilicon compound (A) is 10,000, preferably 15,000, and more preferably 20,000. In addition, the upper limit of the weight average molecular weight is 10,000,000, preferably 1,000,000, and more preferably 300,000. When the weight average molecular weight of the organosilicon compound (A) is within the above range, the obtained molded body can exhibit high heat resistance and the like.

The organosilicon compound (A) is preferably represented by the following formula (1).

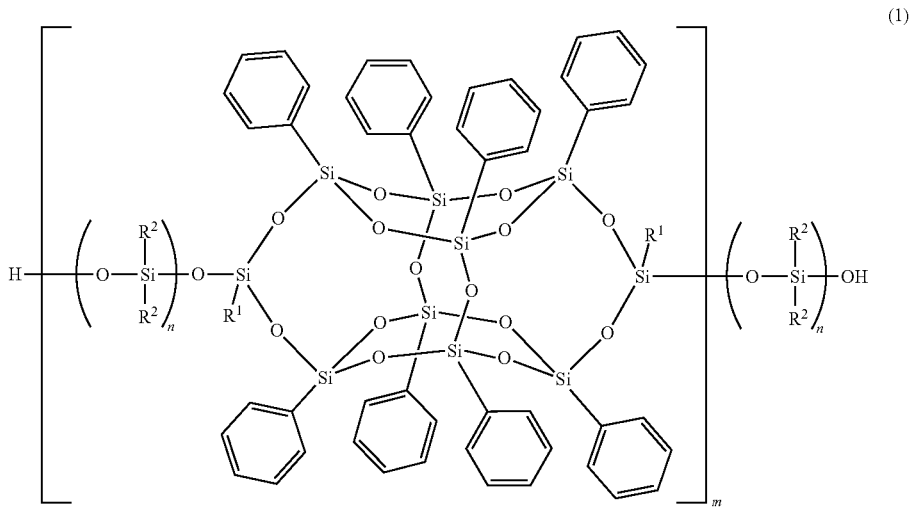

(1)

In formula (1), each $R^1$ is independently a hydrocarbon group having 1 to 8 carbon atoms. Each $R^2$ is independently a hydrocarbon group having 1 to 8 carbon atoms. m is a numerical value satisfying the weight average molecular weight of 10,000 or more and 10,000,000 or less. n is an average value satisfying 1 to 30.

Specific examples and suitable examples of the hydrocarbon groups represented by $R^1$ and $R^2$ in formula (1) are the same as those of the hydrocarbon groups represented by $R^1$ and $R^2$ in the structural unit (i) and the structural unit (ii).

The above m is a numerical value satisfying the weight average molecular weight of 10,000 or more and 10,000,000 or less. Specifically, the lower limit of m is 5 for example, preferably 10, more preferably 15, and further preferably 40. In addition, the upper limit of m is 8,000 for example, preferably 5,000, and more preferably 1,000, 500 or 200.

The lower limit of n is 1, preferably 2, and more preferably 3. In addition, the upper limit of n is 30, preferably 15, more preferably 10, and further preferably 6. When n is within the above range, the performance of the structural unit (i) being a silsesquioxane structure and the performance of the structural unit (ii) being a siloxane structure is well-balanced, and the heat resistance or the like of the obtained molded body is further improved.

m in formula (1) is regarded to represent the polymerization degree of the structural unit (i) in the organosilicon compound (A). n is regarded to represent the average number of the structural units (ii) (the polymerization degree of the polysiloxane chain) in the polysiloxane chain in which the structural units (ii) are connected. In addition, mn+n is regarded to be substantially equal to the polymerization degree of the structural unit (ii) in the organosilicon compound (A).

The specific structure of the organosilicon compound (A) represented by the above formula (1) is as follows when the structural unit (i) is set as X, the structural unit (ii) is set as Y, m is 2 and n is 5. However, because m and n are respectively average values, the number of continuously arranged Y (structural units (ii)), that is, the average number of the structural units (ii) in the polysiloxane chain may be different even in one molecule.

H—Y—Y—Y—Y—Y—X—Y—Y—Y—Y—Y—
X—Y—Y—Y—Y—Y—OH

The lower limit of the content of the organosilicon compound (A) with respect to a total of 100 parts by mass of the organosilicon compound (A) and the organometallic compound (B) in the condensation-curable resin composition (α) is preferably 80 parts by mass, more preferably 90 parts by mass, further preferably 95 parts by mass, and even more preferably 97 parts by mass. On the other hand, the upper limit of the content is preferably 99.9 parts by mass, and more preferably 99.5 parts by mass.

<Method for Producing Organosilicon Compound (A)>

The method for producing the organosilicon compound (A) is not particularly limited, and may be, for example, a method of performing equilibrium polymerization on a compound represented by the following formula (2-1) and a compound represented by the following formula (2-2) in the presence of a catalyst.

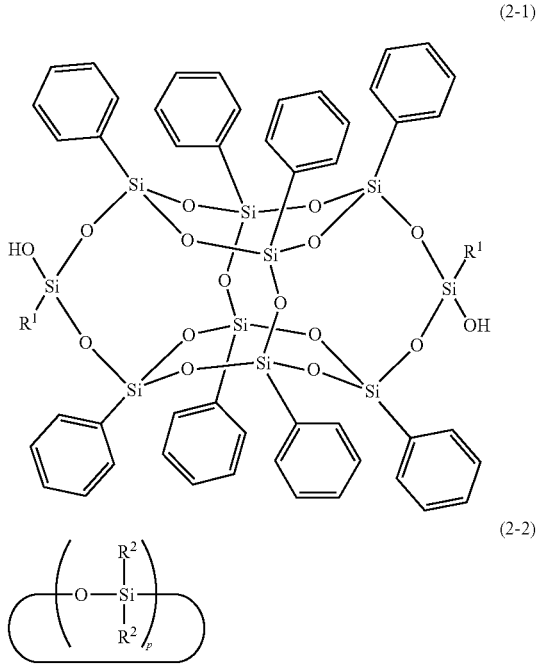

(2-1)

(2-2)

In formula (2-1), each $R^1$ is independently a hydrocarbon group having 1 to 8 carbon atoms.

In formula (2-2), each $R^2$ is independently a hydrocarbon group having 1 to 8 carbon atoms. p is an integer of 3 to 8.

Specific examples and suitable examples of $R^1$ in the above formula (2-1) are the same as those of $R^1$ in the above formula (i) and formula (1). Specific examples and suitable examples of $R^2$ in the above formula (2-2) are the same as those of $R^2$ in the above formula (ii) and formula (1). The above p is preferably an integer of 3 to 6, and more preferably 4. Moreover, n in the above (1) depends on the value of p, that is, the structure and the like of the compound represented by the above formula (2-2).

As for each of the compound represented by the above formula (2-1) and the compound represented by the above formula (2-2), one type may be used or two or more types may be used. The use ratio of the compound represented by the above formula (2-1) and the compound represented by the above formula (2-2) can be appropriately set according to the polymerization degree of each structural unit in the target organosilicon compound.

The catalyst used in the above method is preferably an acid catalyst. The acid catalyst may be hydrochloric acid, sulfuric acid, fluorosulfuric acid, trifluoromethanesulfonic acid, activated clay, a cation exchange resin such as a sulfonic acid ion exchange resin which serves as an acid catalyst, and the like. Among these acid catalysts, trifluoromethanesulfonic acid, activated clay, and a cation exchange resin is preferable.

A more specific method for synthesizing the organosilicon compound (A) may be, for example, the method described in Synthesis example 1 of Japanese Patent Laid-open No. 2010-116464.

(Organometallic Compound (B))

The organometallic compound (B) is an organometallic compound having three or more condensation-reactive groups. The organometallic compound (B) undergoes a cross-linking reaction with the organosilicon compound (A).

The condensation-reactive group may be an alkoxy group, an acetoxy group, an oxime group (—O—N=CR$_2$: R is a hydrocarbon group), a halogen atom and the like. These condensation-reactive groups are preferably bonded to metal atoms. The condensation-reactive group is preferably an alkoxy group. The alkoxy group may be an alkoxy group having an alkyl group having 1 to 4 carbon atoms, such as a methoxy group, an ethoxy group, a propoxy group and a butoxy group. Among these groups, a methoxy group and an ethoxy group are preferable, and a methoxy group is more preferable.

The metal atom contained in the organometallic compound (B) may be silicon, titanium, aluminum, zirconium and the like, and is preferably silicon. Moreover, in the present specification, metalloid atoms such as silicon and germanium are also included in the metal atoms.

From the viewpoints of crosslinkability, heat resistance and mechanical properties of the obtained molded body, and the like, the organometallic compound (B) is preferably a compound having four or more condensation-reactive groups. Furthermore, the organometallic compound (B) is preferably a compound in which four condensation-reactive groups are bonded to a metal atom, a hydrolysis condensate of this compound, and a combination thereof. The hydrolysis condensate is preferably a linear compound.

More specifically, a suitable organometallic compound (B) may be a compound represented by the following formula (2).

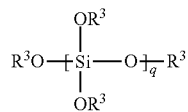

(2)

In formula (2), each $R^3$ is independently an alkyl group having 1 to 4 carbon atoms. q is an average value satisfying 1 to 100.

The alkyl group represented by the above $R^3$ may be a methyl group, an ethyl group, a propyl group and a butyl group. A methyl group and an ethyl group are preferable, and a methyl group is more preferable.

The upper limit of q is preferably 10, and the lower limit of q is preferably 2.

Among the organic metal compounds (B), the compound having three condensation-reactive groups may be methyltrimethoxysilane, methyltriethoxysilane, phenyltrimethoxysilane, phenyltriethoxysilane, glycidyltrimethoxysilane, mercaptotrimethoxysilane, mercaptotriethoxysilane, aminopropyltriethoxysilane, and the like. Among the organometallic compounds (B), the compound having four condensation-reactive groups may be tetramethoxysilane, tetraethoxysilane, tetraisopropyl titanate, tetranormalbutyl titanate, and the like. Among the organometallic compounds (B), the compound having five or more condensation-reactive groups may be partial hydrolysis condensates of each of the above compounds.

Commercially available organic metal compounds (B) may be: MKC silicate MS57 (trademark), MKC silicate MS51 (trademark) (pentamer of tetramethoxysilane in average), and MKC silicate MS56 and MS56S (both are trademarks) which are manufactured by Mitsubishi Chemical Co., Ltd.; Methyl silicate 51 (tetramer of tetramethoxysilane), Methyl silicate 53 (heptamer of tetramethoxysilane), Ethyl silicate 40 (pentamer of tetraethoxysilane), and Ethyl silicate 48 (decamer of tetraethoxysilane) which are manufactured by Colcoat Co., Ltd.; and the like.

The lower limit of the content of the organometallic compound (B) with respect to a total of 100 parts by mass of the organosilicon compound (A) and the organometallic compound (B) in the condensation-curable resin composition (α) is preferably 0.1 part by mass, and more preferably 0.5 part by mass. On the other hand, the upper limit of the content is preferably 10 parts by mass, and more preferably 5 parts by mass.

In addition, as for the mixing ratio of the organosilicon compound (A) and the organometallic compound (B) in the condensation-curable resin composition (α), the ratio of the molar number of condensation-reactive groups of the organometallic compound (B) with respect to the molar number of silanol groups of the organosilicon compound (A) (condensation-reactive group/silanol group) is preferably greater than 1. From the viewpoint of sufficiently advancing the cross-linking reaction, the above ratio (condensation-reactive group/silanol group) is preferably 1.5 or more, and more preferably 2 or more. On the other hand, from the viewpoint of sufficiently containing the organosilicon compound (A) which is a component capable of exhibiting excellent heat resistance, the above ratio (condensation-reactive group/silanol group) is preferably 15 or less, and more preferably 5 or less.

(Condensation Catalyst (C))

The condensation catalyst (C) is not particularly limited as long as it is a catalyst that causes a condensation reaction between the organosilicon compound (A) and the organometallic compound (B). The catalyst may be a tin-based catalyst, a titanium-based catalyst, a bismuth-based catalyst and the like, preferably a tin-based catalyst and a titanium-based catalyst, and more preferably a tin-based catalyst.

The tin-based catalyst may be an organic tin compound such as dibutyltin dilaurate, dioctyltin dilaurate, dibutyltin diacetate, dioctyltin diacetate, dibutyltin maleate, dioctyltin maleate, tin 2-ethylhexanoate, and the like.

When the organometallic compound (B) is an organosilicon compound, as the (C) condensation catalyst, an organotitanium compound such as titanium tetra-2-ethylhexoxide, titanium tetra-n-butoxide, titanium tetraisopropoxide can also be used as a suitable catalyst.

The content of the condensation catalyst (C) with respect to a total of 100 parts by mass of the organosilicon compound (A) and the organometallic compound (B) in the condensation-curable resin composition ($\alpha$) can be set to, for example, $10^{-7}$ part by mass or more and 1 part by mass or less.

(Solvent (D))

The solvent (D) is preferably a solvent capable of dissolving the organosilicon compound (A), the organometallic compound (B) and the like and having no reactivity with the contained components.

The solvent (D) may be an aliphatic hydrocarbon solvent such as hexane and heptane, an aromatic hydrocarbon solvent such as benzene, toluene and xylene, an ether solvent such as diethyl ether, tetrahydrofuran (THF), dioxane and propylene glycol monomethyl ether acetate (PGMEA), a halogenated hydrocarbon solvent such as methylene chloride and carbon tetrachloride, an ester solvent such as ethyl acetate and butyl acetate, and the like.

The content of the solvent (D) in the condensation-curable resin composition ($\alpha$) is not particularly limited and is, for example, preferably 10 mass % or more and 80 mass % or less, and more preferably 20 mass % or more and 60 mass % or less.

(Fluorescent Substance (E))

The fluorescent substance (E) is usually dispersedly contained in the condensation-curable resin composition ($\alpha$). When the condensation-curable resin composition ($\alpha$) further contains the fluorescent substance (E), the condensation-curable resin composition ($\alpha$) can be more suitably used as encapsulation materials for semiconductor devices, specifically, formation materials of wavelength conversion layers and the like.

The fluorescent substance (E) may be an inorganic fluorescent substance such as a YAG fluorescent substance, a TAG fluorescent substance, and a silicate-based fluorescent substance, or an organic fluorescent substance such as an allylsulfoamide-melamine formaldehyde cocondensation dye and a perylene-based fluorescent substance.

The lower limit of the content of the fluorescent substance (E) in the condensation-curable resin composition ($\alpha$) is preferably 1 part by mass, more preferably 10 parts by mass and further preferably 30 parts by mass with respect to a total of 100 parts by mass of the organosilicon compound (A) and the organometallic compound (B). On the other hand, the upper limit of the content is preferably 80 parts by mass, and more preferably 50 parts by mass. By setting the content of the fluorescent substance (E) in the above range, it is possible to have sufficient heat resistance and the like and sufficiently exhibit the characteristics (fluorescence characteristics, wavelength conversion characteristics, etc.) of the fluorescent substance (E).

(White Pigment (F))

The white pigment (F) is usually dispersedly contained in the condensation-curable resin composition ($\alpha$). When the condensation-curable resin composition ($\alpha$) further contains the white pigment (F), the condensation-curable resin composition ($\alpha$) can be more suitably used as encapsulation materials for semiconductor devices, specifically, formation materials of light reflection plates and the like. In addition, when the condensation-curable resin composition ($\alpha$) further contains the white pigment (F), the obtained cured product or molded body has excellent heat resistance and is not prone to a decrease in light reflectance even when exposed to a high temperature for a long period of time.

The white pigment (F) may be titanium oxide, barium titanate, magnesium oxide, antimony oxide, zirconium oxide, inorganic hollow particles and the like, and titanium oxide is preferable among these pigments.

The lower limit of the content of the white pigment (F) in the condensation-curable resin composition ($\alpha$) is preferably 10 parts by mass and more preferably 20 parts by mass with respect to a total of 100 parts by mass of the organosilicon compound (A) and the organometallic compound (B). On the other hand, the upper limit of the content is preferably 80 parts by mass, and more preferably 50 parts by mass. By setting the content of the white pigment (F) in the above range, it is possible to have sufficient heat resistance and the like and sufficiently exhibit the characteristics (light reflectivity, etc.) of the white pigment (F).

(Inorganic Oxide (G))

The inorganic oxide (G) is usually dispersedly contained in the condensation-curable resin composition ($\alpha$). The inorganic oxide (G) does not contain a component corresponding to the fluorescent substance (E) or the white pigment (F). The inorganic oxide (G) may be silica, alumina and the like which function as a filler, or may be nanosilica and the like which function as a sedimentation inhibitor. The content of the inorganic oxide (G) in the condensation-curable resin composition ($\alpha$) is preferably 0.1 part by mass or more and 80 parts by mass or less with respect to a total of 100 parts by mass of the organosilicon compound (A) and the organometallic compound (B).

(Other Components)

The condensation-curable resin composition ($\alpha$) may contain components other than the components (A) to (G) described above. Other components may be a flame retardant, an ion adsorbent, an antioxidant, a curing retarder, a curing inhibitor, an ultraviolet absorber and the like.

The content of the components other than the above components (A) to (G) can be appropriately set according to the application and the like. On the other hand, the content of these other components may be preferably small. The upper limit of the content of the components other than the components (A) to (G) in the condensation-curable resin composition ($\alpha$) may be preferably 10 mass %, 1 mass % or 0.1 mass %. On the other hand, the lower limit of the content of the components other than the above components (A) to (G) may be, for example, 0.01 mass %, 0.1 mass % or 1 mass %.

(Preparation Method)

The method for preparing the condensation-curable resin composition ($\alpha$) is not particularly limited, and the condensation-curable resin composition ($\alpha$) can be prepared by a method of mixing each component using a known mixer or other methods.

(Application)

The condensation-curable resin composition ($\alpha$) can be suitably used as encapsulation materials for optical semiconductor elements, encapsulation materials for other semiconductor elements, formation materials for wavelength conversion layers, light reflection plates, buffer materials, insulating films, sealing materials, optical lenses and the like, adhesives, and so on. In particular, because the molded body obtained by curing has excellent crack resistance in a high temperature environment and hardly causes thermal deterioration of the light transmission property, strength and the like, it can be suitably used as encapsulation materials for semiconductor elements, especially encapsulation materials for optical semiconductor elements. In addition, in particular, when containing the fluorescent substance (E), the condensation-curable resin composition ($\alpha$) is suitably used as formation materials for wavelength conversion layers of light emitting devices such as optical semiconductor devices. When containing the white pigment (F), the condensation-curable resin composition ($\alpha$) is suitably used as formation materials for light reflection plates of light emitting devices such as optical semiconductor devices.

<Condensation-Curable Resin Composition ($\beta$)>

A condensation-curable resin composition ($\beta$) according to an embodiment of the present invention is a condensation-curable resin composition containing an organosilicon compound, wherein when the following tensile test and the following light transmittance measurement of a cured product obtained under the following thermosetting conditions are performed before and after heating the cured product at 250° C. for 504 hours in an air atmosphere, the ratio (Eb/Ea) of a breaking elongation (Eb) after the heating to a breaking elongation (Ea) before the heating is 0.1 or more, the ratio (Sb/Sa) of a breaking stress (Sb) after the heating to a breaking stress (Sa) before the heating is 0.5 or more and less than 10, and the ratio (Tb/Ta) of a light transmittance (Tb) after the heating to a light transmittance (Ta) before the heating is 0.9 or more.

(Thermosetting Conditions)

heating is continuously performed in an air atmosphere in an order of 70° C. for 30 minutes, 100° C. for one hour, and 200° C. for two hours (Tensile Test)

a strip-shaped test piece with a length of 50 mm, a width of 5 mm and a thickness of 0.2 mm is made, and the test piece is subjected to the tensile test at a tensile speed of 5 mm/min at a temperature of 25° C.

(Measurement of Light Transmittance)

the transmittance of light at a wavelength of 350 nm is measured for a test piece that is a cured product with a thickness of 0.1 mm Moreover, the details of each test and measurement are as described in the examples.

The lower limit of the ratio of the breaking elongation (Eb/Ea) is 0.1, and may be more preferably 0.2 or 0.3. The lower limit of the breaking elongation (Ea) before the heating is preferably 5% and more preferably 10%. In addition, the upper limit of the breaking elongation (Ea) before the heating is preferably 300%. In this way, the cured product of the condensation-curable resin composition ($\beta$) maintains a certain degree of breaking elongation even when exposed to a high temperature for a long period of time, and hardly causes embrittlement. Moreover, the upper limit of the ratio of the breaking elongation (Eb/Ea) is preferably 2 and more preferably 1.5.

The lower limit of the ratio of the breaking stress (Sb/Sa) is preferably 0.6 and more preferably 0.8. On the other hand, the upper limit of the ratio (Sb/Sa) is preferably 7 and more preferably 5. In this way, the cured product of the condensation-curable resin composition ($\beta$) has a small change in breaking stress even when exposed to a high temperature for a long period of time. Therefore, according to the condensation-curable resin composition ($\beta$), it is possible to obtain a molded body which hardly causes embrittlement even when exposed to a high temperature for a long period of time.

The ratio (Tb/Ta) of the light transmittance (Tb) after the heating to the light transmittance (Ta) before the heating is 0.9 or more and more preferably 1.0 or more. In this way, the cured product of the condensation-curable resin composition (p) maintains light transmittance even when exposed to a high temperature for a long period of time, and hardly causes coloring. Moreover, the light transmittance (Ta) before the heating is preferably 98% or more, more preferably 99% or more, and further preferably 100%.

Specific and suitable formulations of the condensation-curing resin composition ($\beta$) may be the formulations of the condensation-curing resin composition ($\alpha$) described above. On the other hand, it is preferable that each of the ratio of the breaking elongation (Eb/Ea), the ratio of the breaking stress (Sb/Sa) and the ratio of the light transmittance (Tb/Ta) obtained by the above method is also in the above range in the condensation-curable resin composition ($\alpha$).

<Cured Product>

A cured product according to an embodiment of the present invention is a cured product obtained by curing the above-mentioned condensation-curable resin composition ($\alpha$) or condensation-curable resin composition ($\beta$). The cured product can be obtained by heating the condensation-curable resin composition ($\alpha$) or the condensation-curable resin composition ($\beta$) by a known method. The heating temperature at this time can be, for example, 60 to 250° C., and the heating time can be set to, for example, 1 to 24 hours. Moreover, the cured product may be a product in which a cross-linking reaction occurs in at least a part of the components in the condensation-curable resin composition and the fluidity is lowered, and the cured product is not limited to a completely cured product. That is, the cured product also includes a product having elasticity or viscosity, a product that is softened or melted by heating, and other products. Because the condensation-curable resin composition ($\alpha$) or the condensation-curable resin composition ($\beta$) is used, the cured product hardly causes embrittlement even when exposed to a high temperature for a long period of time, and it is possible to obtain a molded body which hardly causes embrittlement even when exposed to a high temperature for a long period of time. Specifically, the cured product and the molded body obtained from the cured product are excellent in crack resistance in a high temperature environment and hardly cause thermal deterioration of the mechanical strength and the like. In addition, the cured product and the molded body obtained from the cured product are also excellent in color resistance in a high temperature environment, and hardly cause thermal deterioration of the light transmission property.

The cured product may be a B-stage cured product. The B-stage cured product is a cured product in a semi-cured state. Specifically, the B-stage cured product is preferably solid at 25° C. and has a softening point in the range of 100° C. or higher and 200° C. or lower. The B-stage cured product can be obtained by heating the condensation-curing resin composition ($\alpha$) or the condensation-curing resin composition ($\beta$) in a temperature range of 100 to 250° C. for 1 to 5 hours for example.

The shape of the cured product is not particularly limited and may be powdery, granular, plate-like, sheet-like, and so on. In addition, the cured product may be molded into a predetermined shape.

<Molded Body>

A molded body according to an embodiment of the present invention is a molded body obtained from the condensation-curable resin composition (α), the condensation-curable resin composition (β), or the cured product. The molded body may be an encapsulation material for a semiconductor element such as an optical semiconductor element, a wavelength conversion layer, a light reflection plate, a buffer material, an insulating film, a sealing material, an optical lens and the like, preferably an encapsulation material for a semiconductor element, and more preferably an encapsulation material for an optical semiconductor element.

The molded body may be a molded body obtained by using a mold or the like to cure the above-mentioned condensation-curable resin composition (α) or condensation-curable resin composition (β) so as to have a predetermined shape, or a molded body obtained by processing the cured product into a predetermined shape. In addition, a molded body or the like obtained by further heating and curing the cured product in a semi-cured state or other states is also included.

The minimum light transmittance of the molded body in the wavelength range of 350 to 800 nm is preferably 95% or more, and more preferably 99% or more. That is, in the wavelength range of 350 to 800 nm, the lowest transmittance is preferably 95% or 99% or more. When having such a high light transmittance, the molded body becomes more useful as an encapsulation material for an optical semiconductor element or the like. Moreover, the upper limit of the light transmittance is 99.9% for example, and may be 99%.

<Semiconductor Device>

A semiconductor device according to an embodiment of the present invention includes a semiconductor element and the molded body that encapsulates the semiconductor element.

The semiconductor element may be an optical semiconductor element or other semiconductor elements. The optical semiconductor element is not particularly limited. When the optical semiconductor element is a LED, for example, it may be formed by laminating a semiconductor material on a substrate. In this case, the semiconductor material may be, for example, GaAs, GaP, GaAlAs, GaAsP, AlGaInP, GaN, InN, AlN, InGaAlN, SiC and the like.

The semiconductor device is obtained by encapsulating a semiconductor element with the condensation-curable resin composition or the cured product according to an embodiment of the present invention. The encapsulation method can be a known method. When the condensation-curing resin composition is used, for example, the encapsulation method may be: (1) a method in which the condensation-curing resin composition is injected into a mold formwork in advance, a lead frame or the like to which a semiconductor element is fixed is immersed therein, and then heat-curing is performed; (2) a method of injecting the condensation-curable resin composition into a mold formwork into which a semiconductor element has been inserted, and heat-curing the resin composition; and other methods. The method for injecting the condensation-curable resin composition may be, for example, transfer molding and injection molding.

Furthermore, other encapsulation methods may be, for example, a method of pasting the cured product in a semi-cured state on a semiconductor element and then heat-curing the cured product.

Because the condensation-curable resin composition or the cured product according to an embodiment of the present invention is used as an encapsulation material in the semiconductor device, the encapsulation material has excellent crack resistance in a high temperature environment and hardly causes thermal deterioration of the light transmission property, strength and the like. Therefore, the semiconductor device is excellent in long-term durability even if it has a high output and a high power density. Therefore, the semiconductor device is preferably an optical semiconductor device. The optical semiconductor device can be used for various lighting devices, electric bulletin boards, traffic lights, backlights of liquid crystal display devices, LED displays, and the like.

EXAMPLE

The present invention is described in more detail based on examples. Moreover, the present invention is not limited to the following examples. The method for analyzing the synthesized organosilicon compound is shown below.

<Number Average Molecular Weight and Weight Average Molecular Weight>

A measurement was performed by a GPC method under the following conditions using a high performance liquid chromatograph system CO-2065 plus manufactured by JASCO Corporation and taking 20 µL of a THF solution having a sample concentration of 1 mass % as an analysis sample. The number average molecular weight and the weight average molecular weight were obtained in terms of polystyrene.

Column: Shodex KF804L [manufactured by Showa Denko KK] (two columns are connected in series)

Column temperature: 40° C.

Detector: RI

Eluent: THF

Flow rate of eluent: 1.0 mL/min

<NMR (Nuclear Magnetic Resonance Spectrum)>

A measurement was performed using a 400 MHz NMR measurement device manufactured by JEOL Ltd., with the measurement sample dissolved in deuterated acetone (manufactured by Wako Pure Chemical Industries, Ltd.). In addition, the average polysiloxane chain length introduced in the synthesized organosilicon compound (n in the above formula (1)) was determined from the integral ratio of $^1$H-NMR.

[Synthesis Example 1] <Synthesis of Silsesquioxane Derivative (DD-4OH)>

A silsesquioxane derivative (DD-4OH) represented by the following formula was synthesized by the method described in Japanese Patent No. 5704168.

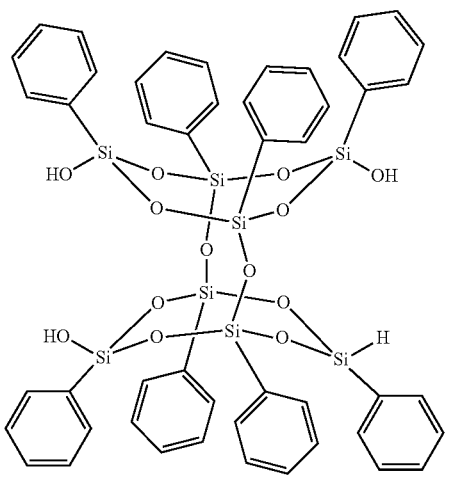 [SMILES: O[Si]1(c2ccccc2)O[Si]2(c3ccccc3)O[SiH](c3ccccc3)O[Si](c3ccccc3)(O1)O[Si]1(c3ccccc3)O[Si](O)(c3ccccc3)O[Si](c3ccccc3)(O[Si](O)(c3ccccc3)O1)O2]

[Synthesis Example 2] <Synthesis of Silsesquioxane Derivative (DD(Me)-OH)>

A silsesquioxane derivative (DD(Me)-OH) represented by the following formula was synthesized by the method described in Japanese Patent No. 4379120. Moreover, the silsesquioxane derivative (DD-40H) synthesized in Synthesis example 1 was used as the raw material.

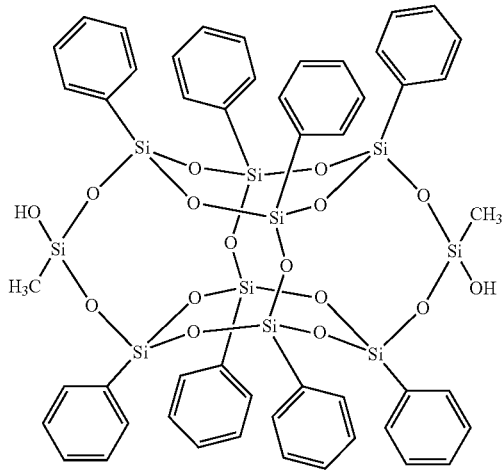 [SMILES: C[Si]1(O)O[Si]2(c3ccccc3)O[Si]3(c4ccccc4)O[Si]4(c5ccccc5)O[Si](C)(O)O[Si]5(c6ccccc6)O[Si](c6ccccc6)(O[Si](c6ccccc6)(O1)O[Si](c1ccccc1)(O5)O[Si](c1ccccc1)(O2)O4)O3]

[Synthesis Example 3] Synthesis of Organosilicon Compound (A-1)

A cooling tube, a mechanical stirrer and a thermometer protection tube were attached to a 3 L flask, and nitrogen replacement was performed for the inside of the flask. 400 g of a silsesquioxane derivative (DD(Me)-OH), 200 g of octamethylcyclotetrasiloxane (D4) (manufactured by Momentive Performance Materials), 40.8 g of a strongly acidic cation exchange resin ("RCP-160M" (water content: 23.4 mass %) manufactured by Mitsubishi Chemical Corporation was dried and used), 961 g of dehydrated toluene, and 9.6 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 439 g of a white solid was obtained thereby. According to $^1$H-NMR and GPC analysis, it was confirmed that the obtained white solid is an organosilicon compound (A-1), which is an organosilicon compound represented by the above formula (1), and in which $R^1$ and $R^2$ in formula (1) are methyl groups, m is 43.6, n is 5.3, the number average molecular weight Mn is 34,000, the weight average molecular weight Mw is 68,000, the polymerization degree of the structural unit (i) is 43.6, and the polymerization degree of the structural unit (ii) is 230.9.

[Synthesis Example 4] Synthesis of Organosilicon Compound (A-2)

A cooling tube, a mechanical stirrer and a thermometer protection tube were attached to a 300 mL flask, and nitrogen replacement was performed for the inside of the flask. 40.0 g of a silsesquioxane derivative (DD(Me)-OH), 20.0 g of octamethylcyclotetrasiloxane (D4) (manufactured by Momentive Performance Materials), 8.2 g of a strongly acidic cation exchange resin ("RCP-160M" (water content: 23.4 mass %) manufactured by Mitsubishi Chemical Corporation was dried and used), 10.2 g of dehydrated toluene, and 1.0 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 43.6 g of a white solid was obtained thereby. According to $^1$H-NMR and GPC analysis, it was confirmed that the white solid is an organosilicon compound (A-2), which is an organosilicon compound represented by the above formula (1), and in which $R^1$ and $R^2$ in formula (1) are methyl groups, m is 29.2, n is 5.5, the number average molecular weight Mn is 23,000, the weight average molecular weight Mw is 46,000, the polymerization degree of the structural unit (i) is 29.2, and the polymerization degree of the structural unit (ii) is 160.6.

[Synthesis Example 5] Synthesis of Organosilicon Compound (A-3)

A cooling tube, a mechanical stirrer and a thermometer protection tube were attached to a 500 mL flask, and nitrogen replacement was performed for the inside of the flask. 100 g of a silsesquioxane derivative (DD(Me)-OH), 50.0 g of octamethylcyclotetrasiloxane (D4) (manufactured by Momentive Performance Materials), 20.4 g of a strongly acidic cation exchange resin ("RCP-160M" (water content: 23.4 mass %) manufactured by Mitsubishi Chemical Corporation was dried and used), 256 g of dehydrated toluene, and 2.4 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 71.5 g of a white solid was obtained thereby. According to $^1$H-NMR and GPC analysis, it was confirmed that the obtained white solid is an organosilicon compound (A-3), which is an organosilicon compound represented by the above formula (1), and in which $R^1$ and $R^2$ in formula (1) are methyl groups, m is 24.6, n is 5.1, the number average molecular weight Mn is 20,000, the weight average molecular weight Mw is 38,000, the polymerization degree of the structural unit (i) is 24.6, and the polymerization degree of the structural unit (ii) is 125.4.

[Synthesis Example 6] Synthesis of Organosilicon Compound (A-4)

A cooling tube, a mechanical stirrer and a thermometer protection tube were attached to a 300 mL flask, and nitrogen replacement was performed for the inside of the flask. 48.0 g of a silsesquioxane derivative (DD(Me)-OH), 18.0 g of octamethylcyclotetrasiloxane (D4) (manufactured by Momentive Performance Materials), 9.0 g of a strongly acidic cation exchange resin ("RCP-160M" (water content: 23.4 mass %) manufactured by Mitsubishi Chemical Corporation was dried and used), 112 g of dehydrated toluene, and 1.0 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 56.1 g of a white solid was obtained thereby. According to $^1$H-NMR and GPC analysis, it was confirmed that the obtained white solid is an organosilicon compound (A-4), which is an organosilicon compound represented by the above formula (1), and in which $R^1$ and $R^2$ in formula (1) are methyl groups, m is 61.5, n is 4.2, the number average molecular weight Mn is 31,000, the weight average molecular weight Mw is 91,000, the polymerization degree of the structural unit (i) is 61.5, and the polymerization degree of the structural unit (ii) is 258.4.

[Synthesis Example 7] Synthesis of Organosilicon Compound (A-5)

A cooling tube, a mechanical stirrer and a thermometer protection tube were attached to a 500 mL flask, and nitrogen replacement was performed for the inside of the flask. 100 g of a silsesquioxane derivative (DD(Me)-OH), 32.5 g of octamethylcyclotetrasiloxane (D4) (manufactured by Momentive Performance Materials), 18.0 g of a strongly acidic cation exchange resin ("RCP-160M" (water content: 23.4 mass %) manufactured by Mitsubishi Chemical Corporation was dried and used), 226 g of dehydrated toluene, and 1.8 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 108.6 g of a white solid was obtained thereby. According to $^1$H-NMR and GPC analysis, it was confirmed that the obtained white solid is an organosilicon compound (A-5), which is an organosilicon compound represented by the above formula (1), and in which $R^1$ and $R^2$ in formula (1) are methyl groups, m is 40.9, n is 3.7, the number average molecular weight Mn is 24,000, the weight average molecular weight Mw is 59,000, the polymerization degree of the structural unit (i) is 40.9, and the polymerization degree of the structural unit (ii) is 151.4.

[Synthesis Example 8] Synthesis of Organosilicon Compound (A-6)

A cooling tube, a magnetic stirrer and a thermometer protection tube were attached to a 300 mL flask, and nitrogen replacement was performed for the inside of the flask. 50 g of a silsesquioxane derivative (DD(Me)-OH), 18.8 g of octamethylcyclotetrasiloxane (D4) (manufactured by Momentive Performance Materials), 5.6 g of a strongly acidic cation exchange resin ("RCP-160M" (water content: 23.4 mass %) manufactured by Mitsubishi Chemical Corporation was dried and used), 100 g of dehydrated toluene, and 0.6 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 42.8 g of a white solid was obtained thereby. According to $^1$H-NMR and GPC analysis, it was confirmed that the obtained white solid is an organosilicon compound (A-6), which is an organosilicon compound represented by the above formula (1), and in which $R^1$ and $R^2$ in formula (1) are methyl groups, m is 78.2, n is 4.6, the number average molecular weight Mn is 31,000, the weight average molecular weight Mw is 118,000, the polymerization degree of the structural unit (i) is 78.2, and the polymerization degree of the structural unit (ii) is 359.7.

[Synthesis Example 9] Synthesis of Organosilicon Compound (A-7)

A cooling tube, a magnetic stirrer and a thermometer protection tube were attached to a 300 mL flask, and nitrogen replacement was performed for the inside of the flask. 50 g of a silsesquioxane derivative (DD(Me)-OH), 62.5 g of octamethylcyclotetrasiloxane (D4) (manufactured by Momentive Performance Materials), 5.0 g of a strongly acidic cation exchange resin ("RCP-160M" (water content: 23.4 mass %) manufactured by Mitsubishi Chemical Corporation was dried and used), 100 g of dehydrated toluene, and 0.5 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 74.0 g of a white solid was obtained thereby. According to $^1$H-NMR and GPC analysis, it was confirmed that the obtained white solid is an organosilicon compound (A-7), which is an organosilicon compound represented by the above formula (1), and in which $R^1$ and $R^2$ in formula (1) are methyl groups, m is 26.6, n is 13.7, the number average molecular weight Mn is 23,000, the weight average molecular weight Mw is 58,000, the polymerization degree of the structural unit (i) is 26.6, and the polymerization degree of the structural unit (ii) is 363.9.

[Synthesis Example 10] Synthesis of Organosilicon Compound (A-8)

A cooling tube, a magnetic stirrer and a thermometer protection tube were attached to a 500 mL flask, and nitrogen replacement was performed for the inside of the flask. 100 g of a silsesquioxane derivative (DD(Me)-OH), 37.6 g of octamethylcyclotetrasiloxane (D4) (manufactured by Momentive Performance Materials), 10.0 g of a strongly acidic cation exchange resin ("RCP-160M" (water content: 23.4 mass %) manufactured by Mitsubishi Chemical Corporation was dried and used), 200 g of dehydrated toluene, and 1.0 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 113.0 g of a white solid was obtained thereby. According to $^1$H-NMR and GPC analysis, it was confirmed that the obtained white solid is an organosilicon compound (A-8), which is an organosilicon compound represented by the above formula (1), and in which $R^1$ and $R^2$ in formula (1) are methyl groups, m is 57.0, n is 4.6, the number average molecular weight Mn is 31,000, the weight average molecular weight Mw is 86,000, the polymerization degree of the structural unit (i) is 57.0, and the polymerization degree of the structural unit (ii) is 262.2.

[Synthesis Example 11] Synthesis of Organosilicon Compound (A-9)

A cooling tube, a mechanical stirrer and a thermometer protection tube were attached to a 100 mL flask, and nitrogen replacement was performed for the inside of the flask. 20 g of a silsesquioxane derivative (DD(Me)-OH), 7.5 g of octamethylcyclotetrasiloxane (D4) (manufactured by Momentive Performance Materials), 3.7 g of a strongly acidic cation exchange resin ("RCP-160M" (water content: 23.4 mass %) manufactured by Mitsubishi Chemical Corporation was dried and used), 31 g of dehydrated toluene, and 0.4 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 20.6 g of a white solid was obtained thereby. According to $^1$H-NMR and GPC analysis, it was confirmed that the obtained white solid is an organosilicon compound (A-9), which is an organosilicon compound represented by the above formula (1), and in which $R^1$ and $R^2$ in formula (1) are methyl groups, m is 119.0, n is 4.2, the number average molecular weight Mn is 59,000, the weight average molecular weight Mw is 176,000, the polymerization degree of the structural unit (i) is 119.0, and the polymerization degree of the structural unit (ii) is 499.7.

[Synthesis Example 12] Synthesis of Organosilicon Compound (A-10)

A cooling tube, a magnetic stirrer and a thermometer protection tube were attached to a 500 mL flask, and nitrogen replacement was performed for the inside of the flask. 49.9 g of a silsesquioxane derivative (DD(Me)-OH), 18.8 g of octamethylcyclotetrasiloxane (D4) (manufactured by Momentive Performance Materials), 10.1 g of a strongly acidic cation exchange resin ("RCP-160M" (water content: 23.4 mass %) manufactured by Mitsubishi Chemical Corporation was dried and used), 250 g of dehydrated toluene, and 0.76 g of water were put into the flask. Reflux was performed for one hour and then the mixture was ripened at 50° C. After completion of the ripening, the mixture was cooled to room temperature and the strongly acidic cation exchange resin was filtered off. The obtained filtrate was washed with water several times. Then, the solvent and the low boiling component were distilled off from the filtrate, and the obtained crude product was reprecipitated with methanol for purification. The obtained white viscous liquid was vacuum dried at 40° C., and 30.2 g of a white solid is obtained thereby. According to $^1$H-NMR and GPC analysis, it was confirmed that the obtained white solid is an organosilicon compound (A-10), which is an organosilicon compound represented by the above formula (1), and in which $R^1$ and $R^2$ in formula (1) are methyl groups, m is 16.3, n is 4.1, the number average molecular weight Mn is 8,400, the weight average molecular weight Mw is 24,000, the polymerization degree of the structural unit (i) is 16.3, and the polymerization degree of the structural unit (ii) is 66.7.

Hereinafter, each component used for preparing the condensation-curable resin composition is shown.

(A) Organosilicon Compound

Organosilicon compounds (A-1) to (A-10): the organosilicon compounds (A-1) to (A-10) synthesized in Synthesis examples 3 to 12

Organosilicon compound (a-1): polydimethylsiloxane having a silanol group at both ends ("FM-9927" manufactured by JNC Co., Ltd., number average molecular weight Mn 27,000, molecular weight distribution index (Mw/Mn) 1.05)

(B) Organometallic Compound

Organometallic compound (B-1): a compound in which $R^3$ in the above formula (2) is a methyl group and q is about 5 ("MKC Silicate MS51" manufactured by Mitsubishi Chemical Corporation).

(C) Condensation Catalyst

Condensation catalyst (C-1): dibutyltin dilaurate (manufactured by Wako Pure Chemical Industries, Ltd.)

(D) Solvent

Solvent (D-1): toluene

Solvent (D-2): PGMEA (propylene glycol monomethyl ether acetate)

Solvent (D-3): butyl acetate (E) Fluorescent Substance

Fluorescent substance (E-1): silicate fluorescent substance "EY4254" manufactured by INTEMATIX (G) Inorganic Oxide Inorganic oxide (G-1): silica ("DM30S" manufactured by Tokuyama)

[Examples 1 to 11 and Comparative Example 1]
Preparation of Condensation-Curable Resin Composition Each component was uniformly mixed at the blending ratio (mass %) shown in Table 1 to prepare each condensation-curable resin composition of Examples 1 to 11 and Comparative example 1. Table 1 also shows the ratio of the molar number of condensation-reactive groups of the organometallic compound (B) to the molar number of silanol groups of the organosilicon compound (A) in each condensation-curable resin composition (functional group ratio (SiOMe/SiOH)).

(Preparation of Molded Body A)

Each of the obtained condensation-curable resin compositions was applied to a fluororesin-processed SUS plate (5 mm thick) using an applicator. Then, it was put into an oven and heated at 70° C. for 30 minutes, at 100° C. for one hour, and further at 200° C. for two hours to thereby obtain a molded body A (crosslinked cured product) having a thickness of about 0.2 mm. The thickness of the obtained molded body A was measured using a digimatic indicator ("ID-H0530" manufactured by Mitutoyo).

(Initial Performance/Tensile Test)

A strip-shaped test piece (length 50 mm×width 5 mm) was made using the obtained molded body A. A tensile test was performed using the strip-shaped test piece at a tensile speed of 5 mm/min at 25° C., and the breaking elongation (Ea) and the breaking stress (Sa) were measured. The results are shown in Table 1.

(Heat Resistance Test at 250° C./Tensile Test)

The obtained molded body A was heated in an air atmosphere at 250° C. for a predetermined time as shown in Table 1, and then a strip-shaped test piece (length 50 mm×width 5 mm) was made from each molded body. A tensile test was performed using the strip-shaped test piece at a tensile speed of 5 mm/min at 25° C., and the breaking elongation and the breaking stress were measured. The results are shown in Table 1. In addition, the ratio (Eb/Ea) of the breaking elongation (Eb) after heating for 504 hours to the breaking elongation (Ea) before heating and the ratio (Sb/Sa) of the breaking stress (Sb) after heating for 504 hours to the breaking stress (Sa) before heating are shown in Table 1.

(Preparation of Molded Body B)

Each of the obtained condensation-curable resin compositions was applied to a slide glass ("S9213" manufactured by Matsunami Glass Industry, 1.3 mm thick) using an applicator. Then, it was put into an oven and heated at 70° C. for 30 minutes, at 100° C. for one hour, and further at 200° C. for two hours to thereby obtain a molded body B (crosslinked cured film) having a thickness of 0.1 mm. The thickness of the obtained molded body B was measured using a micrometer ("BMD-25MX" manufactured by Mitutoyo).

(Initial Performance/Evaluation of Light Transmittance)

The light transmittance of the obtained molded body B was measured. The light transmittance was measured using an ultraviolet-visible spectroscopic hardness meter ("V-650" manufactured by JASCO Corporation). A slide glass ("S9213" manufactured by Matsunami Glass Industry, 1.3 mm thick) was set as a reference. The evaluation was set as "○" when the minimum transmittance at a wavelength of 350 to 800 nm was 98% or more, and set as "x" when the minimum transmittance was lower than 98%. The results are shown in Table 1.

(Heat Resistance Test at 250° C./Crack Resistance Test and Evaluation of Light Transmittance)

The obtained molded body B was heated in an air atmosphere at 250° C. for a predetermined time as shown in Table 1. The molded body B being heated was taken out every 168 hours and returned to room temperature, then the appearance was observed and the time when cracks occurred was recorded. The light transmittance of the molded body in which no crack was generated was measured. The results are shown in Table 1. Moreover, the result of "no change" regarding the light transmittance in Table 1 means that the ratio of the transmittance after heating to the transmittance before heating is 0.9 or more for light with any wavelength in the range of 350 to 800 nm. In addition, Table 1 also shows the ratio (Tb/Ta) of the light transmittance (Tb) after heating for 504 hours to the light transmittance (Ta) before heating.

TABLE 1

| | Component | | | Example 1 | Example 2 | Example 3 | Example 4 | Example 5 | Example 6 | Example 7 |
|---|---|---|---|---|---|---|---|---|---|---|
| (A) | A-1 | mass % | | 59.2 | — | — | — | — | — | — |
| | A-2 | | | — | 58.8 | 59.5 | — | — | — | — |
| | A-3 | | | — | — | — | 59.4 | — | — | — |
| | A-4 | | | — | — | — | — | 59.1 | — | — |
| | A-5 | | | — | — | — | — | — | 58.8 | — |
| | A-6 | | | — | — | — | — | — | — | 59.1 |
| | A-7 | | | — | — | — | — | — | — | — |
| | A-8 | | | — | — | — | — | — | — | — |
| | A-9 | | | — | — | — | — | — | — | — |
| — | a-1 | | | — | — | — | — | — | — | — |
| (B) | B-1 | | | 0.8 | 1.2 | 0.5 | 0.6 | 0.9 | 1.2 | 0.9 |
| (C) | C-1 | | | 0.03 | 0.04 | 0.02 | 0.02 | 0.03 | 0.04 | 0.03 |
| (D) | D-1 | | | 40.0 | 40.0 | 40.0 | 40.0 | 40.0 | 40.0 | 40.0 |
| | D-2 | | | — | — | — | — | — | — | — |
| Ratio of functional group | SiOMe/SiOH | | | 5.0 | 5.0 | 2.0 | 2.0 | 5.0 | 5.0 | 5.0 |

TABLE 1-continued

| | | | | | | | | | |
|---|---|---|---|---|---|---|---|---|---|
| Initial performance | Breaking elongation (Ea) | % | 270 | 173 | 290 | 119 | 26 | 19 | 54 |
| | Breaking stress (Sa) | MPa | 1.5 | 3.3 | 0.8 | 2.9 | 9.9 | 16.8 | 6.7 |
| | Light transmittance (350 to 800 nm) | — | ○ | ○ | ○ | ○ | ○ | ○ | ○ |
| Heat resistance test at 250° C. | Crack resistance | | No change for 3024 hours | No change for 1008 hours | No change for 1008 hours | No change for 1008 hours | No change for 1008 hours | No change for 1008 hours | No change for 504 hours (ongoing) |
| | Light transmittance (350 to 800 nm) | | No change for 3024 hours | No change for 1008 hours | No change for 1008 hours | No change for 1008 hours | No change for 1008 hours | No change for 1008 hours | |
| 504 hours | Breaking elongation (Eb) | % | 151 | 29 | 111 | 58 | 39 | 3 | 30 |
| | Breaking stress (Sb) | MPa | 4.8 | 10.2 | 3.9 | 8.7 | 10.8 | 16.2 | 7.4 |
| | Ratio of breaking elongation (Eb/Ea) | — | 0.56 | 0.17 | 0.38 | 0.48 | 1.49 | 0.13 | 0.56 |
| | Ratio of breaking stress (Sb/Sa) | — | 3.20 | 3.09 | 4.88 | 3.00 | 1.09 | 0.96 | 1.10 |
| | Ratio of light transmittance (Tb/Ta) | — | 1.0 | 1.0 | 1.0 | 1.0 | 1.0 | 1.0 | 1.0 |
| 1008 hours | Breaking elongation | % | 115 | 3 | 57 | 13 | 25 | 4 | |
| | Breaking stress | MPa | 6.0 | 13.0 | 6.2 | 11.6 | 11.6 | 14.8 | |
| | Light transmittance at 350 nm | % | 100 | 100 | 100 | 100 | 100 | 100 | |
| 2012 hours | Breaking elongation | % | 41 | | | | | | |
| | Breaking stress | MPa | 7.3 | | | | | | |
| 3016 hours | Breaking elongation | % | 11 | | | | | | |
| | Breaking stress | MPa | 13.7 | | | | | | |

| | Component | | Example 8 | Example 9 | Example 10 | Example 11 | Comparative example 1 |
|---|---|---|---|---|---|---|---|
| (A) | A-1 | mass % | — | — | — | — | — |
| | A-2 | | — | — | — | — | — |
| | A-3 | | — | — | — | — | — |
| | A-4 | | — | — | — | — | — |
| | A-5 | | — | — | — | — | — |
| | A-6 | | — | — | — | — | — |
| | A-7 | | 58.8 | — | — | — | — |
| | A-8 | | — | 65.8 | 65.8 | — | — |
| | A-9 | | — | — | — | 45.0 | — |
| — | a-1 | | — | — | — | — | 98.4 |
| (B) | B-1 | | 1.2 | 1.4 | 1.4 | 0.4 | 1.6 |
| (C) | C-1 | | 0.04 | 0.04 | 0.04 | 0.01 | 0.05 |
| (D) | D-1 | | 40.0 | 32.8 | — | 54.6 | — |
| | D-2 | | — | — | 32.8 | — | — |
| Ratio of functional group | SiOMe/SiOH | | 5.0 | 5.0 | 5.0 | 5.0 | 5.0 |
| Initial performance | Breaking elongation (Ea) | % | — | 71 | 66 | 155 | 150 |
| | Breaking stress (Sa) | MPa | | 6.2 | 4.1 | 12.2 | 0.2 |
| | Light transmittance (350 to 800 nm) | — | | ○ | ○ | ○ | ○ |

TABLE 1-continued

| Heat resistance test at 250° C. | Crack resistance | | | | | | |
|---|---|---|---|---|---|---|---|
| | | | No change for 504 hours (ongoing) | No change for 504 hours (ongoing) | No change for 504 hours (ongoing) | No change for 504 hours (ongoing) | Cracks occur in 168 hours |
| | Light transmittance (350 to 800 nm) | | | | | | No change for 168 hours |
| 504 hours | Breaking elongation (Eb) | % | — | 70 | 58 | 37 | Embrittled (unmeasurable) |
| | Breaking stress (Sb) | MPa | — | 8.9 | 8.2 | 9.7 | |
| | Ratio of breaking elongation (Eb/Ea) | — | — | 0.99 | 0.89 | 0.24 | |
| | Ratio of breaking stress (Sb/Sa) | — | — | 1.43 | 2.01 | 0.80 | |
| | Ratio of light transmittance (Tb/Ta) | — | — | 1.0 | 1.0 | 1.0 | |
| 1008 hours | Breaking elongation | % | | | | 54 | |
| | Breaking stress | MPa | | | | 12.6 | |
| | Light transmittance at 350 nm | % | | | | 100 | |
| 2012 hours | Breaking elongation | % | | | | | |
| | Breaking stress | MPa | | | | | |
| 3016 hours | Breaking elongation | % | | | | | |
| | Breaking stress | MPa | | | | | |

As shown in Table 1, all of the condensation-curable resin compositions of Examples 1 to 6 and 11 that were subjected to the heat resistance test for 1008 hours had an elongation of 3% or more after resisting heat at 250° C. for 1008 hours, suggesting that the compositions hardly cause embrittlement and have strong crack resistance. In addition, in all of the crack tests after the heat resistance test at 250° C., it can be confirmed that no crack is generated even after 1000 hours and embrittlement hardly occurs. Furthermore, the change in light transmittance after the heat resistance test at 250° C. is small, and transparency can be maintained. It can be seen that the cured product obtained from the condensation-curable resin composition of each example hardly causes embrittlement and coloring even when exposed to a high temperature for a long period of time, and has performances required for semiconductor encapsulation materials and the like, such as crack resistance and color resistance in a high temperature environment. Moreover, in Example 8, because the cured product had a strong tack (adhesiveness), the initial breaking elongation and breaking stress were not measured, and because the cured product became cloudy, the light transmittance was not measured. However, it can be confirmed that the cured product obtained from the condensation-curable resin composition of Example 8 also has crack resistance and color resistance in a high temperature environment.

On the other hand, in the condensation-curable resin composition of Comparative example 1, cracks due to resin embrittlement occurred after the heat resistance test at 250° C., and the tensile test and the measurement of light transmittance became impossible.

Example 12

1 g of the condensation-curable resin composition obtained in Example 7 was poured into an aluminum cup having a diameter of 3 cm for rheometer measurement. The condensation-curable resin composition was cured under the conditions of 80° C. for one hour, 100° C. for one hour, 120° C. for one hour, and 200° C. for one hour to obtain a sheet-shaped cured product. A rheometer ("MCR302" manufactured by Anton Paar) was used to perform the rheometer measurement of the cured product under the following conditions. The measurement results are shown in Table 2.

Measurement Condition

Oscillation angle: 0.1%, frequency: 1 Hz, normal force: 0.5 N

Measurement temperature: 30 to 250° C. with a temperature rise rate of 2 to 2.5° C./min

TABLE 2

| | | | Example 12 |
|---|---|---|---|
| Complex viscosity (Pa · s) | | 30° C. | 10,000 |
| | | 150° C. | 640 |
| | | 200° C. | 340 |
| | | 250° C. | 290 |
| Storage elastic modulus (Pa) | | 30° C. | 59,000 |
| | | 150° C. | 2,500 |
| | | 200° C. | 1,200 |
| | | 250° C. | 910 |

TABLE 2-continued

| | | Example 12 |
|---|---|---|
| Loss elastic modulus (Pa) | 30° C. | 18,000 |
| | 150° C. | 3,100 |
| | 200° C. | 1,700 |
| | 250° C. | 1,100 |

As shown in Table 2 above, the sheet-shaped cured product obtained in Example 12 is softened by heating, so that it can be adhered to a semiconductor chip or the like. In addition, the cured product can also be further melt-molded.

Example 13

50.4 mass % of the organosilicon compound (A-7), 0.8 mass % of the organometallic compound (B-1), 0.03 mass % of the condensation catalyst (C-1), 25.2 mass % of the solvent (D-2), 22.9 mass % of the fluorescent substance (E-1) and 0.8 mass % of the inorganic oxide (G-1) were mixed to obtain the condensation-curable resin composition of Example 13.

As for the obtained condensation-curable resin composition, a frame was arranged on a 3 cm×3 cm×2 mm slide glass plate to which a release film was attached so that the height was 1 mm. The obtained condensation-curable resin composition was poured into the frame and cured under the conditions of 80° C. for one hour, 100° C. for one hour, 120° C. for one hour, and 200° C. for one hour, and a cured product (fluorescent sheet) having a thickness of about 0.3 mm was made. The fluorescent sheet was cut out and placed on an aluminum substrate. Then, the fluorescent sheet was heated at 200° C. for 10 minutes and cooled to room temperature. The fluorescent sheet was adhered to the aluminum substrate without deformation.

Examples 14 to 15 and Comparative Example 2

Each component was uniformly mixed at the blending ratio (mass %) shown in Table 3 to prepare each condensation-curable resin composition of Examples 14 to 15 and Comparative example 2. 1 g of each condensation-curable resin composition obtained in Examples 14 to 15 and Comparative example 2 was poured into an aluminum cup having a diameter of 3 cm for rheometer measurement. The condensation-curable resin composition was cured under the conditions of 80° C. for one hour, 100° C. for one hour, 120° C. for one hour, and 200° C. for one hour to obtain a sheet-shaped cured product. A rheometer ("MCR302" manufactured by Anton Paar) was used to perform the rheometer measurement of the cured product under the following conditions. The measurement results are shown in Table 3.

Measurement Condition
  Oscillation angle: 0.1%, frequency: 1 Hz, normal force: 0.5 N
  Measurement temperature: 30 to 250° C. with a temperature rise rate of 2 to 2.5° C./min

TABLE 3

| | Component | | | Example 14 | Example 15 | Comparative example 2 |
|---|---|---|---|---|---|---|
| (A) | A-6 | mass % | | — | 49.6 | 50 |
| | A-10 | | | 48.8 | — | — |
| (B) | B-1 | | | 2.4 | 0.7 | — |
| (C) | C-1 | | | 0.0244 | 0.0000025 | — |
| (D) | D-2 | | | — | 49.6 | 50 |
| | D-3 | | | 48.8 | — | — |
| Storage elastic modulus | 30° C. | Pa | | 37,000 | 37,000 | 53,300 |
| | 150° C. | Pa | | 6 | 90 | 99 |
| | 200° C. | Pa | | 5,400 | 11 | 6 |
| | 250° C. | Pa | | 9,200 | 83 | 2 |
| Loss elastic modulus | 30° C. | Pa | | 1,700 | 8,000 | 17,000 |
| | 150° C. | Pa | | 92 | 2,800 | 3,500 |
| | 200° C. | Pa | | 240 | 73 | 72 |
| | 250° C. | Pa | | 1,200 | 55 | 24 |

The cured product of Example 14 was solid at room temperature, and had a storage elastic modulus of 37,000 Pa and a loss elastic modulus of 1,700 Pa at 30° C. It was found that the storage elastic modulus at 150° C. was 6 Pa and the loss elastic modulus was 92 Pa, indicating a performance of superior viscosity. It was found that the storage elastic modulus at 200° C. was 5,400 Pa and the loss elastic modulus was 240 Pa, indicating a performance of favorable elasticity. That is, it was found that the cured product can be melted around 150° C. and be cured and molded around 200° C.

The cured product of Example 15 was solid at room temperature, and had a storage elastic modulus of 37,000 Pa and a loss elastic modulus of 8,000 Pa at 30° C. The storage elastic modulus at 200° C. was 11 Pa and the loss elastic modulus was 73 Pa, indicating a performance of a superior viscosity at 200° C. The storage elastic modulus at 250° C. was 83 Pa, the loss elastic modulus was 55 Pa, and the elasticity is superior around 250° C. It was found that the cured product can be melted around 200° C. and be cured and molded at 250° C. or higher.

The cured product of Comparative example 2 was solid at room temperature, and had a storage elastic modulus of 53,300 Pa at 30° C. and a loss elastic modulus of 17,000 Pa. When the temperature was raised to 150° C. and 200° C., the storage elastic modulus decreased significantly and showed melting behavior, but even when the temperature was raised to 250° C., the storage elastic modulus continued to decrease, and curing-molding was not possible.

INDUSTRIAL APPLICABILITY

The condensation-curable resin composition of the present invention can be suitably used as encapsulation materials for optical semiconductor elements, encapsulation materials for other semiconductor elements, formation materials for wavelength conversion layers, light reflection plates, buffer materials, insulating films, sealing materials, optical lenses and the like, other adhesives, and so on.

What is claimed is:

1. A condensation-curable resin composition containing:
   (A) an organosilicon compound containing a structural unit (i) represented by the following formula (i) and a structural unit (ii) represented by the following formula (ii), having a SiOH group at both ends of the molecular chain, and having a weight average molecular weight of 15,000 or more and 10,000,000 or less; and
   (B) an organometallic compound having six or more condensation-reactive groups, wherein the condensation-reactive group is at least one selected from the group consisting of an alkoxy group, an acetoxy group, an oxime group, and a halogen atom,

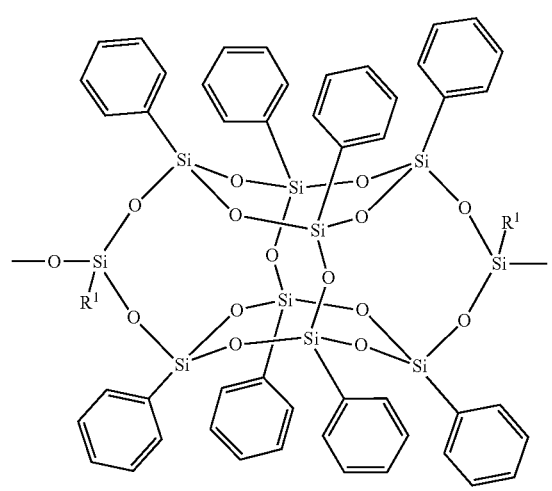

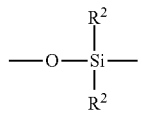

in formula (i), each $R^1$ is independently a hydrocarbon group having 1 to 8 carbon atoms, and in formula (ii), each $R^2$ is independently a hydrocarbon group having 1 to 8 carbon atoms, wherein a content of the organosilicon compound (A) with respect to a total of 100 parts by mass of the organosilicon compound (A) and the organometallic compound (B) is 80 parts by mass to 99.9 parts by mass, a content of the organometallic compound (B) with respect to the total of 100 parts by mass of the organosilicon compound (A) and the organometallic compound (B) is 0.1 parts by mass to 20 parts by mass, and a ratio of a molar number of the condensation-reactive groups of the organometallic compound (B) with respect to a molar number of silanol groups of the organosilicon compound (A) (condensation-reactive group/silanol group) is 1.5 or more and 15 or less.

2. The condensation-curable resin composition according to claim 1, wherein a polymerization degree of the structural unit (i) in the organosilicon compound (A) is 10 or more and 8,000 or less, and a polymerization degree of the structural unit (ii) is 1 or more and 10,000 or less.

3. The condensation-curable resin composition according to claim 1, wherein the organosilicon compound (A) is represented by the following formula (1),

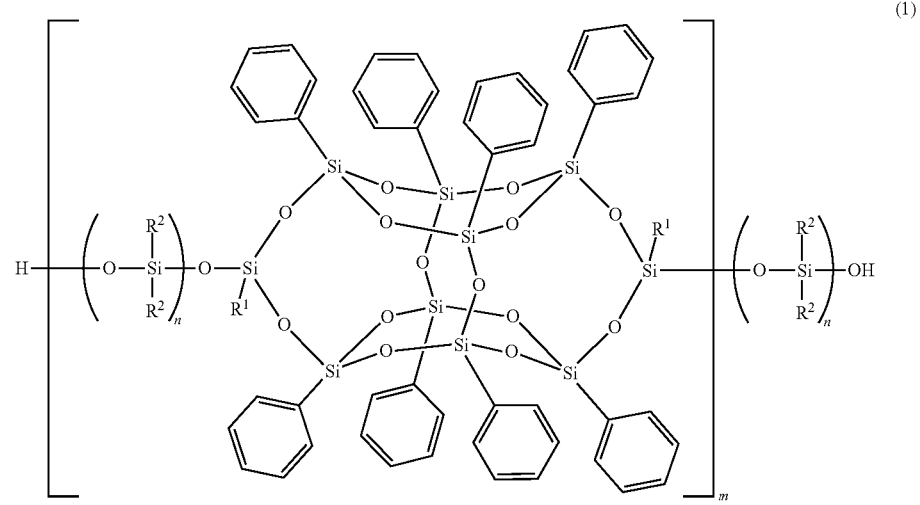

in formula (1), each $R^1$ is independently a hydrocarbon group having 1 to 8 carbon atoms, each $R^2$ is independently a hydrocarbon group having 1 to 8 carbon atoms, m is a numerical value satisfying the weight average molecular weight of 15,000 or more and 10,000,000 or less, and n is an average value satisfying 1 to 30.

4. The condensation-curable resin composition according to claim 1, wherein the organometallic compound (B) is represented by the following formula (2),

(2)

in formula (2), each $R^3$ is independently an alkyl group having 1 to 4 carbon atoms, and q is an average value satisfying 2 to 100.

5. The condensation-curable resin composition according to claim 1, further containing (C) a condensation catalyst.

6. The condensation-curable resin composition according to claim 1, further containing (D) a solvent.

7. The condensation-curable resin composition according to claim 1, further containing (E) a fluorescent substance, (F) a white pigment, or (G) an inorganic oxide, wherein the inorganic oxide (G) does not comprise components corresponding to the fluorescent substance (E) or the white pigment (F).

8. The condensation-curable resin composition according to claim 7, wherein the content of the fluorescent substance (E) is 1 part by mass or more and 80 parts by mass or less with respect to the total of 100 parts by mass of the organosilicon compound (A) and the organometallic compound (B).

9. The condensation-curable resin composition according to claim 7, wherein the white pigment (F) is titanium oxide, and the content of the white pigment (F) is 10 parts by mass or more and 80 parts by mass or less with respect to the total of 100 parts by mass of the organosilicon compound (A) and the organometallic compound (B).

10. The condensation-curable resin composition according to claim 1, wherein
when the following tensile test and the following light transmittance measurement of a cured product obtained under the following thermosetting conditions are performed before and after heating the cured product at 250° C. for 504 hours in an air atmosphere,
a ratio of a breaking elongation after the heating to a breaking elongation before the heating is 0.1 or more,
a ratio of a breaking stress after the heating to a breaking stress before the heating is 0.5 or more and less than 10, and
a ratio of a light transmittance after the heating to a light transmittance before the heating is 0.9 or more,
thermosetting conditions:
heating is continuously performed in an air atmosphere in an order of 70° C. for 30 minutes, 100° C. for one hour, and 200° C. for two hours
tensile test:
a strip-shaped test piece with a length of 50 mm, a width of 5 mm and a thickness of 0.2 mm is made, and the test piece is subjected to the tensile test at a tensile speed of 5 mm/min at a temperature of 25° C.
measurement of light transmittance:
a transmittance of light at a wavelength of 350 nm is measured for a test piece that is a cured product with a thickness of 0.1 mm.

11. A cured product obtained by curing the condensation-curable resin composition according to claim 1.

12. A molded body obtained from the condensation-curable resin composition according to claim 1.

13. A semiconductor device comprising a semiconductor element and the molded body according to claim 12 for encapsulating the semiconductor element.

14. A molded body obtained from the cured product according to claim 11.

* * * * *